United States Patent [19]

Leroux

[11] Patent Number: 4,940,940
[45] Date of Patent: Jul. 10, 1990

[54] METHOD OF RADIO-FREQUENCY EXCITATION IN AN NMR EXPERIMENT

[75] Inventor: Patrick Leroux, Gif sur Yvette, France

[73] Assignee: General Electric CGR SA, Paris, France

[21] Appl. No.: 309,798

[22] PCT Filed: Jul. 2, 1987

[86] PCT No.: PCT/FR87/00260
§ 371 Date: Jan. 10, 1989
§ 102(e) Date: Jan. 10, 1989

[30] Foreign Application Priority Data

Jul. 11, 1986 [FR] France ................................ 86 10179

[51] Int. Cl.$^5$ ............................................ G01R 33/20
[52] U.S. Cl. ..................................... 324/309; 324/308
[58] Field of Search ............... 324/307, 308, 309, 311, 324/312, 313, 314

[56] References Cited

U.S. PATENT DOCUMENTS 4,521,732 6/1985 Pegg et al. ........................ 324/308

OTHER PUBLICATIONS

Journal of Magnetic Resonance, vol. 61, 1985, B. Blumich, et al, "Quaternions as a Practical Tool for the Evaluation of Composite Rotations", pp. 356–362.
Journal of Magnetic Resonance, vol. 63, 1985, C. Counsell, et al, "Analytical Theory of Composite Pulses", pp. 133–141.
Physical Review B, vol. 25, Jun. 1, 1982, M. M. Maricq, "Application of Average Hamiltonian Theory to the NMR of Solids", pp. 6622–6632.
Journal of Magnetic Resonance, vol. 67, Mar. 1, 1986, R. Brandes, et al, "Generation of Tailored Radiofrequency Pulses by a Simple Audio Frequency Filter Method. II Analysis", pp. 14–27.

Primary Examiner—Michael J. Tokar
Attorney, Agent, or Firm—Oblon, Spivak, McClelland, Maier & Neustadt

[57] ABSTRACT

In order to optimize the determination of radio-frequency energization in an NMR experiment, the Schrodinger equation is written relative to the amplitude of probability of the wave function of spins resonating at a given resonance frequency wherein the Hamiltonian depends on the frequency and on the radio-frequency energization to which they are subjected. Analytical polynominal expressions are deduced for the probability amplitudes at the end of the energization as a function of the resonance frequency. The coefficients are optimized by means of calculation algorithms, from which the characteristics of the energization are deduced.

3 Claims, 2 Drawing Sheets

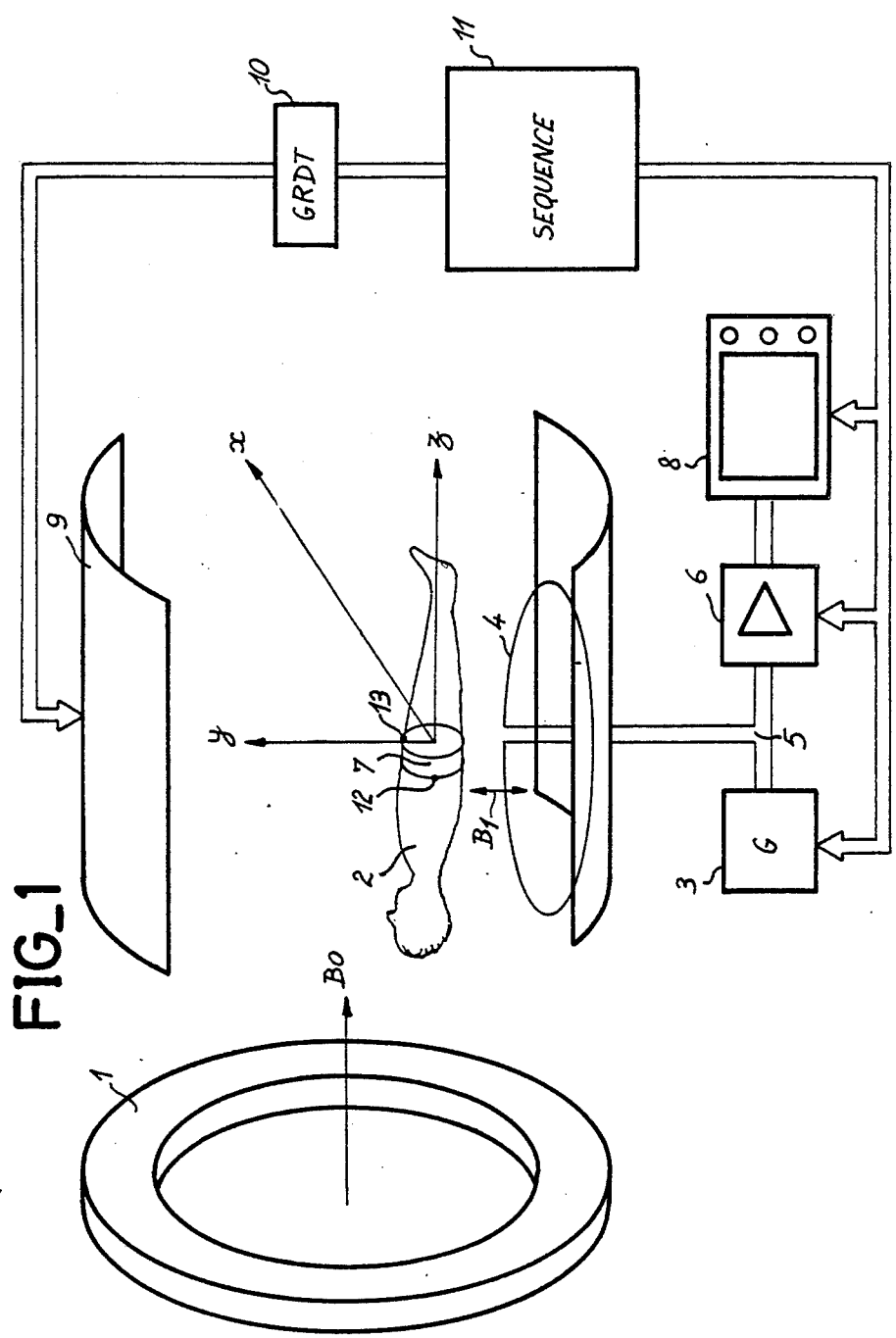
FIG_1

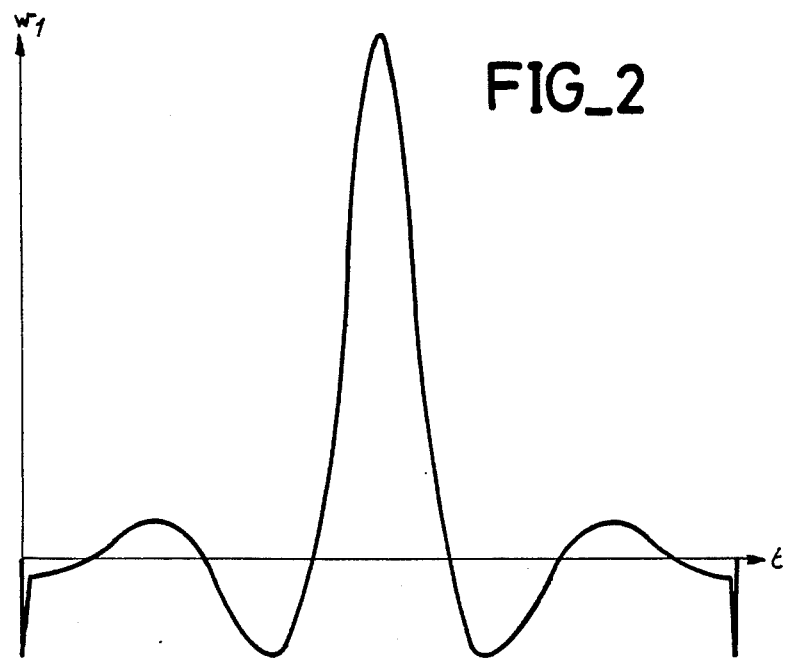
FIG_2
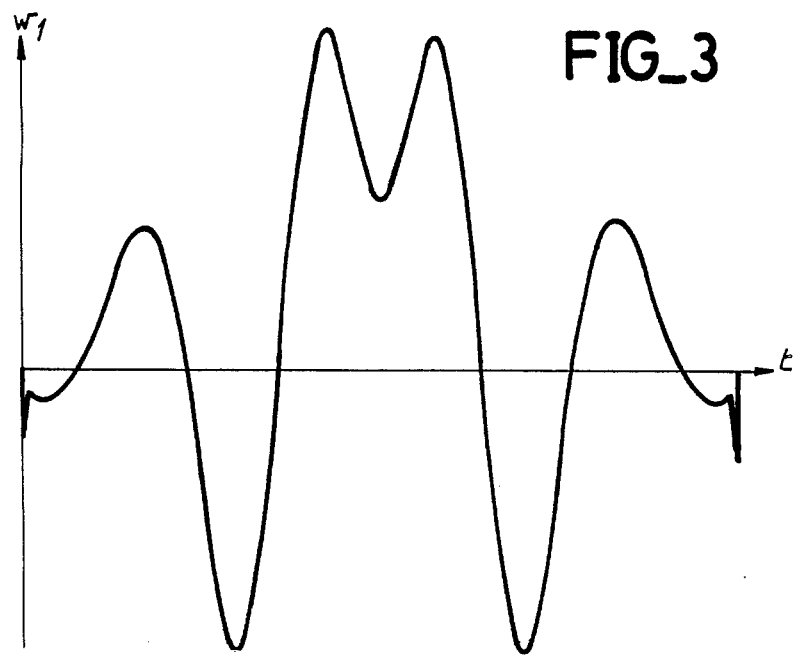
FIG_3

METHOD OF RADIO-FREQUENCY EXCITATION IN AN NMR EXPERIMENT

The present invention relates to a method of radio-frequency excitation in a nuclear magnetic resonance (NMR) experiment. The invention is more particularly applicable to the medical field in which NMR machines are employed for diagnosis in human beings. However, the invention can also find applications in the field of laboratory work or in industry whenever magnetic resonance phenomena are employed.

The magnetic resonance phenomenon results from the orientation acquired by the magnetic moments of particles of a body when said body is subjected to a constant orienting magnetic field. In order to exhibit this phenomenon, the body is excited with a radio-frequency excitation. It is possible to measure the signal representing de-excitation of the particles when they return to their state of equilibrium, when their magnetic moment is reoriented with the orienting field, at the end of angular shift of said orientation which depends on the excitation. The excitation is applied to the entire body which is subjected to examination and all the body particles emit a de-excitation signal upon completion. In the medical field in which it is sought to represent images of cross-sections of the body (of a patient) under examination, it is a customary practice to limit inception of the resonance phenomenon to selected cross-sections, the images of which are to be produced. To this end, the conditions of resonance are modified locally in such a manner as to ensure that only the selected slice is subjected to conditions of resonance corresponding to the frequency of the radio-frequency excitation. Outside the slice, the magnetic moments are not tilted and those particles which are external to the slice do not restitute any de-excitation signal.

Modification of local resonance conditions is obtained by increasing or reducing the intensity of the orienting field in the selected slice. For scientific and technological reasons, it is not possible to produce an abrupt change in intensity of a constant magnetic field on each side of a slice of space. Modification of the field then takes the form of a regular variation as a function of the abscissa of the loci of the space on an axis perpendicular to the slice to be selected The intensity of the orienting field is therefore subjected to a gradient along said axis and in practice the supplementary fields, added to the constant and homogeneous field throughout the space in order to produce this variation, are commonly referred-to as the field gradients. The resonance frequency of the resonance phenomenon is proportional to the intensity of the orienting field. In order to select a slice, it is therefore necessary, in radio-frequency excitation, to ensure that the spectrum of excitation contains only components which are included within a band limited by cutoff frequencies corresponding to the resonance frequencies of the particles of the edges of the slice.

In order to obtain a narrow-spectrum excitation signal, this signal cannot be instantaneous but lasts a certain time. In practice, powers of a few kilowatts applied during time intervals of a few tens of milliseconds are common. The fact that the excitation pulse is not instantaneous and that on the contrary it lasts a certain time accordingly gives rise to disturbances in the de-excitation signal. In fact, as a result of the field gradient, the particles of the edges of the slice do not resonate at the same frequencies. For example, if the center of the slice resonates at a frequency $f_o$, the upstream and downstream edges of the slice with respect to the orientation of the field are capable of resonating at frequencies $f_o - \Delta f$ or $f_o + \Delta f$ respectively. In consequence, the history of excitation in the edges of the slice is not the same as at the center even though the excitation time has been the same for all the particles of the slice. If the geometrical angular shift of all the magnetic moments is correctly obtained in respect of a given excitation energy (for example they are all located in a plane perpendicular to the orienting field in the case of a 90° excitation), their orientation is in that case not single but may on the contrary be distributed in all directions contained in a plane. The orientation of each moment in these directions depends on the abscissa of the points considered in the slice. In fact, in their movement of forced precession for taking part in the required geometrical angular shift, the magnetic moments have followed different paths. These paths are different since the precession velocities are related to the resonance frequencies. Since the initial orientation of the magnetic moments is the same in all cases, it is apparent that there is not a priori any reason for this orientation to be single at the end of the angular shift. If no precautions are taken, the magnetic moments of the various points of the slice may be disoriented and displaced in phase with respect to each other to such an extent that the electromagnetic restitution signal can have a zero mean value. It is in that case impossible to obtain any physical information from this latter.

Furthermore, the magnetic resonance phenomenon does not take place at a single frequency but rather at neighboring frequencies. The difference between these frequencies and a reference frequency is known as the chemical shift. This difference is usually less than $2\Delta f$. Workers in this field seek to obtain an excitation which would be capable in a given experiment to differentiate the response corresponding to each value of said chemical shift. It would accordingly be possible, in particular in medical images, to produce a water-fat separation in the tissues. In fact, in the different tissues, if the water shift with respect to fat has the same value in frequency, the amplitudes of the components do not have the same values from one tissue to another. Furthermore, in another type of application and in particular in the field of imagery, it is planned to construct so-called multisection or rather multislice excitations. The object in view would be to benefit by a gradient which extends in space over a distance which is considerably greater than the thickness of the slice and to obtain an excitation which is capable of exciting at the same time a number of slices which are preferably non-contiguous so as to accelerate the image reconstruction processes. In point of fact, the work undertaken for definition of conventional excitation pulses (at 90° and at 180°) has appeared so complex that those versed in the art do not intend to increase the complexity even further in order to produce such excitations at the present time.

In the present state of the art, the problem of determination of the excitation signal has been solved by successive approximations and tentative experiments which have gradually made it possible to determine the history of its amplitude during the pulse period in order to achieve the desired results. However, in spite of the months of work required in order to arrive at these results, optimization of the excitation pulses is not guaranteed, especially in regard to the total power employed as well as the instantaneous power. The object of the present invention is to propose a method for determination of the excitation while also taking into account an optimization criterion which may even be different from these latter.

The technique employed in the present state of the technique for determining excitations essentially consists in dividing a predetermined excitation time into a sufficient number of periods such as 40, for example, and in calculating for each abscissa of the slice the rotation during each period of the magnetic moment of the protons which are present. The calculation is carried out as a function of a parameter which is representative of the amplitude of excitation during the corresponding period. This parameter is progressively varied in time during the period of excitation. The movement of the magnetic moment is a movement of precession which is due to the resonance frequency (and therefore dependent on the abscissa in the slice) combined with a movement of nutation imposed by the radio-frequency excitation which is identical throughout the slice. In order to determine the component in one direction of space of the magnetic moment of a particle at the end of a period, it therefore involves the use of the components in the three directions of space of the magnetic moment of said particle prior to commencement of the period, these three components being dependent, as a result of the gradient, on the abscissa of the point in the slice. In consequence, the calculation must be carried out abscissa by abscissa in the case of all the abscissae within the thickness along the slice.

In practice, these calculations have been undertaken for about one hundred abscissae uniformly distributed across and slightly on each side of the slice. The work involved in determination has consisted in performing the entire calculation and in repeating it a number of times while modifying, period by period, the history of variation of the parameter in order to obtain at the end of a pulse a requisite definition in amplitude and in phase of the angular shift of the magnetic moments of the particles subjected to experimentation. These calculations are concerned with all the particles within the slice and adjacent to the slice, that is to say a set of resonance frequencies. In another approach which is justified solely in the case of small angles of nutation of lower value than 30°, for example, use is made of the fact that the expression of the transverse magnetization as a function of the resonance frequency is directly the Fourier transform of the excitation time signal. This hypothesis becomes of little validity when the desired angle of nutation has a value of 90° and is completely false when it has a value of 180°.

The present invention makes it possible to overcome the above-mentioned disadvantages by proposing a completely different method of calculation of the excitation pulse. In this method, the angle of nutation of each magnetic moment is not calculated directly at each abscissa. One expresses in a polynomial analytical form as a function of the resonance frequency only the probability that this moment will have a desired orientation at the end of excitation. In the calculations, the expression in polynomial form dispenses with the need for information relating to localization of the protons concerned (or of their resonance frequency, which amounts to the same thing) in order to be in a position to propose a solution which offers a better compromise with respect to an optimization criterion at all the resonance frequencies involved. By transposing said optimization to syntheses of filters by Fourier transform, the invention accordingly permits rapid achievement of a desired solution (in a few minutes).

The present invention has for its object a method of radio-frequency excitation in an NMR experiment in which, in response to said excitation, the angular shifts of magnetic moments of particles subjected to experiment are defined in amplitude and in phase for a given set of resonance frequencies, characterized in that:

the Schrödinger equation is written relative to the amplitude of probability of the wave function of spins resonating at a given resonance frequency and in which the Hamiltonian depends on the frequency and on the radio-frequency excitation to which they are subjected, this equation is integrated with respect to time, analytical polynomial expressions are deduced therefrom for the probability amplitudes at the end of excitation as a function of the resonance frequency, these polynomial expressions being equal in degree to a number of elementary periods in which the sum of time-durations is equal to the excitation time, the parameters of these expressions being coefficients which are representative of the history of excitation during said periods, these coefficients are optimized by means of calculation algorithms so as to ensure that the polynomials come as close as possible to a desired form, the characteristics, during each period, of the excitation which results in this defined response are deduced, the particles are excited with this excitation.

A better understanding of the present invention will be gained from a perusal of the following description and from examination of the accompanying figures. This description does not imply any limitation of the invention. In particular, the imaging application mentioned earlier is only one particular case of a radio-frequency excitation.

As shown in the figures,

FIG. 1 is a schematic representation of an NMR machine;

FIGS. 2 and 3 are shapes of excitation amplitude envelopes determined in accordance with the invention.

FIG. 1 shows diagrammatically a nuclear magnetic resonance imaging machine. This machine essentially comprises means 1 for producing a constant and homogeneous orienting magnetic field $B_O$ in a location in which a body 2 to be examined is placed. The body 2 is subjected at this location to a radio frequency excitation produced by a generator 3 in relation with an antenna 4. The antenna also serves to collect the de-excitation signal and to direct it by means of a duplexer 5 to receiving and processing means 6. When processing has been completed, the image of a cross-section 7 of the body 2 can be displayed on a display device 8. In order to subject the magnetic moments of the protons of the body 2 located within the slice 7 to the resonance phenomenon (and those moments alone), gradient coils 9 supplied by a gradient pulse generator 10 have been employed. All these means operate under the control of a sequencer 11. Supposing that the supplementary magnetic field applied by the coils 9 varies linearly along an axis z parallel to the field $B_O$, it may be stated that the edges of 12 and 13 of the slice 7 respectively on the upstream and downstream side encounter different resonance conditions and that the resonance frequencies of the protons located at said edges are different.

In the invention, in order to determine the radio-frequency excitation, the Schrödinger equation is written relative to the amplitude of probability of the wave function of spins resonating at a given resonance frequency. This expression is as follows:

$$j \frac{d|\phi>}{dt} = H_a|\phi>$$

In this formula $H_a$ is the Hamiltonian of the equation; it depends on the frequency and on the radio-frequency excitation to which the resonating spins are subjected. The term $|\rho>$ represents the wave function. This Hamiltonian can be written as follows:

$$H_a = \frac{1}{2} \begin{vmatrix} -w & -w_x + jw_y \\ -w_x - jw_y & w \end{vmatrix}$$

In these equations, j is the complex number such that $j^2 = -1$. The angular frequencies w, and $w_x$ and $w_y$ are respectively the difference in resonance angular frequency within the slice 7 as a function of the abscissa along z of the protons concerned, and the representations of the radio-frequency components of the excitation field $B_1$ emitted by the antenna 4. These components are evaluated in a reference element which rotates at an angular frequency $w_O$ corresponding to the radio-frequency excitation carrier wave and to the resonance frequency of the protons located at the center of the slice 7. From the Schrödinger equation is derived the following expression:

$$\begin{vmatrix} \frac{da}{dt} \\ \frac{db}{dt} \end{vmatrix} = \begin{vmatrix} \frac{jw}{2} & -\frac{w_1 e^{-j\phi}}{2} \\ \frac{w_1 e^{j\phi}}{2} & \frac{-jw}{2} \end{vmatrix} \begin{vmatrix} a \\ b \end{vmatrix} \quad \text{I}$$

where a and b are the amplitudes of probability for ensuring that the spins of the protons considered are in a respectively positive or negative state after transformation by the kinetic moment operator along z. In Expression I, it has been postulated that:

$$j(w_x + jw_y) = w_1 e^{j\phi}$$

where $w_1$ is the amplitude of the radio-frequency excitation and where $\phi$ is its emission phase with respect to the axes x and y. This phase is conventionally zero when the emission is along the axis $-y$.

In order to integrate the Equation I with respect to time, it is found preferable to carry out a known approximation of the so-called "hard pulse" type. In accordance with this approximation, it is considered that the protons are subjected to two different actions during excitation. A first continuous action is relative to the presence of the orienting field gradient in the slice 7 and has the effect of shifting the resonance angular frequency w. The second action $w_1$ corresponds to the radio-frequency excitation proper. In practice, $w_1$ varies progressively in time and it is sought to determine its progressive variation. By sampling $w_1$, it can be represented in the form of a sequence of values which are blocked in steps during elementary periods and vary abruptly from one step to another, from the end of one period to the beginning of another. The approximation considered consists in replacing the stepwise variation of the second action by a sequence of pulses of the Dirac type of very short duration $\epsilon$ having an amplitude $w_i$ equal to $w_1(t).\tau/\epsilon$, where $w_1(t)$ is the value of the radio-frequency excitation steps and where $\tau$ is the duration of an elementary period. The effect of this approximation is to considerably simplify Equation I. It may in fact be stated that, during the hard pulses, during the Dirac pulses, the equation is written:

$$\begin{vmatrix} \frac{da}{dt} \\ \frac{db}{dt} \end{vmatrix} = \begin{vmatrix} 0 & \frac{w_i}{2} e^{-j\phi i} \\ \frac{w_i}{2} e^{j\phi i} & 0 \end{vmatrix} \begin{vmatrix} a \\ b \end{vmatrix}$$

because $w_i$ is considerably greater than the effect of the orienting field gradient.

Outside periods of application of the Dirac pulse excitations, this expressions can simply be written:

$$\begin{vmatrix} \frac{da}{dt} \\ \frac{db}{dt} \end{vmatrix} = \begin{vmatrix} j\frac{w}{2} & 0 \\ 0 & \frac{-jw}{2} \end{vmatrix} \begin{vmatrix} a \\ b \end{vmatrix}$$

since in this case the Dirac pulse is not present. Each of the two expressions given above can be integrated with respect to time. The calculation is conventional and we may write respectively:

$$\begin{vmatrix} a_i^+ \\ b_i^+ \end{vmatrix} = \begin{vmatrix} \cos \theta_i/2 & -e^{-j\phi i} \sin \theta_i/2 \\ e^{j\phi i} \sin\theta_i/2 & \cos \theta_i/2 \end{vmatrix} \begin{vmatrix} a_i^- \\ b_i^- \end{vmatrix}$$

and $$\begin{vmatrix} a_{i+1}^- \\ b_{i+1}^- \end{vmatrix} = \begin{vmatrix} e^{j\frac{w\tau}{2}} & 0 \\ 0 & e^{-j\frac{w\tau}{2}} \end{vmatrix} \begin{vmatrix} a_i^+ \\ b_i^+ \end{vmatrix}$$

In these expressions, the amplitudes of probability bear the $-$ sign or the $+$ sign, depending on whether they correspond to these probabilities before or after application of the corresponding Dirac pulse i. They bear indices i or i+1 according to the rank i of the preceding Dirac pulse. In these expressions $\theta_i = w_i.\epsilon = w_i(t).\tau$. If we also postulate in order to simplify the expressions that:

$$e^{jw\tau} = z$$

$$\cos \theta_i/2 = c_i$$

and $$e^{j\phi i} \sin \theta_i/2 = s_i$$

we may write that after an $n^{th}$ Dirac pulse, by omitting the + signs:

$$\begin{vmatrix} a_n \\ b_n \end{vmatrix} = \begin{vmatrix} c_n & -\bar{s}_n \\ s_n & c_n \end{vmatrix} \begin{vmatrix} z^{\frac{1}{2}} & 0 \\ 0 & z^{-\frac{1}{2}} \end{vmatrix} \begin{vmatrix} a_{n-1} \\ b_{n-1} \end{vmatrix} \quad \text{II}$$

From the above equation will be deduced the expressions of $a_n$ and $b_n$ as a function of $a_{n-1}$ and $b_{n-1}$. And in these last expressions, by replacing $a_n$ and $b_n$ by:

$$\alpha_n = a_n/z^{n/2} \quad \text{III}$$

and

-continued $$\beta_n = b_n/z^{n/2}$$

we may write $$\alpha_n = c_n \alpha_{n-1} - \bar{s}_n z^{-1} \beta_{n-1} \qquad \text{IV}$$

$$\beta_n = s_n \alpha_{n-1} + c_n z^{-1} \beta_{n-1}$$

Assuming that the orientation of the magnetic moment prior to a first Dirac pulse is known, in particular if said moment is oriented parallel to $B_O$, it may be stated that:

$$\begin{vmatrix} a_0^- \\ b_0^- \end{vmatrix} = \begin{vmatrix} 1 \\ 0 \end{vmatrix} = \begin{vmatrix} \alpha_0^- \\ \beta_0^- \end{vmatrix}$$

and therefore $$\begin{vmatrix} a_0^+ \\ b_0^+ \end{vmatrix} = \begin{vmatrix} a_0 \\ b_0 \end{vmatrix} = \begin{vmatrix} c_0 \\ s_0 \end{vmatrix} = \begin{vmatrix} \alpha_0 \\ \beta_0 \end{vmatrix}$$

In the last expression, $\alpha_O$ and $\beta_O$ depends on $c_O$ and $s_O$ which are representative of the amplitude of the first Dirac pulse numbered 0. This formulation may also be written:

$$\alpha_0 = c_0 = h_0^0 z^{-0}$$

and $$\beta_0 = s_0 = g_0^0 z^{-0}$$

where $z^O$ has the conventional value of 1. After the second pulse (numbered n=1), we may write:

$$\alpha_1 = c_1 c_0 - \bar{s}_1 s_0 z^{-1} = h_0^1 z^{-0} + h_1^1 z^{-1}$$

$$\beta_1 = s_1 c_0 - c_1 s_0 z^{-1} = g_0^1 z^{-0} + g_1^1 z^{-1}$$

Likewise after a third pulse (numbered n=2), we may write:

$$\alpha_2 = c_2(c_1 c_0 - \bar{s}_1 s_0 z^{-1}) - \bar{s}_2 z^{-1}(s_1 c_0 - c_1 s_0 z^{-1})$$

namely $$\alpha_2 = h_0^2 z^{-0} + h_1^2 z^{-1} + h_2^2 z^{-2}$$

and likewise we could write for $\beta_2$:

$$\beta_2 = g_0^2 z^{-0} + g_1^2 z^{-1} + g_2^2 z^{-2}$$

And so on and more generally after the n plus one$^{th}$ pulse numbered n, $\alpha_n$ and $\beta_n$ are written:

$$\alpha_n = h_0^n z^{-0} + h_1^n z^{-1} + \ldots + h_n^n z^{-n} \qquad \text{V}$$

$$\beta_n = g_0^n z^{-0} + g_1^n z^{-1} + \ldots + g_n^n z^{-n}$$

With this expression, two important remarks can be made. In the first place, $\alpha$ and $\beta$ represent, subject to a change of variable, the amplitudes of probability of the wave function transformed by the kinetic moment operator along the axis z. It can also be shown that, just as the square of the modulus of a added to the square of the modulus of b has a value of 1, so the square of the modulus of $\alpha_n$ added to the square of the modulus of $\beta_n$ also has a value of 1. In fact, the probability that the magnetic moment exists always has a value of 1. In the second place, it is observed that the expression of $\alpha_n$ and $\beta_n$ is an analytical polynomial expression in z. In point of fact, z corresponds to the resonant angular frequency as a function of the locus (on account of the gradient), of the protons concerned within the excited space. In the expression of the magnetic moment, z is therefore the term which is representative of the resonance frequency. Just as $c_O$ and $s_O$ were determined by the amplitude of the first Dirac excitation pulse, so it can be stated that the coefficients $h_i^n$ and $g_i^n$ are determined by the sequence of the different Dirac pulses up to the Dirac pulse of number n. These coefficients are expressed, however, independently of the locus of the protons concerned or in other words independently of the frequency. Stated differently, a knowledge of all the $h_i^n$ and $g_{in}$ makes it possible to deduce the shape of the magnetic moment at the end of excitation irrespective of the resonance frequency or in other words irrespective of the position of the protons within the slice.

In the invention, attention is accordingly devoted to the need to find such coefficients $h_i^n$ and $g_i^n$ by imposing constraints related to the values of w. It will be virtually established that the expressions of $\alpha_n$ and $\beta_n$ should be the equations of a filter having one given value within its passband and having another given value outside the passband.

It may be written by transferring the value $\alpha_{n-1}$ and of $\beta_{n-1}$ as a function of the coefficients $h_i^{n-1}$ and $g_i^{n-1}$ of Expression V in Expression IV of $\alpha_n$ and $\beta_n$ which are themselves written as a function of the coefficients $h_i^n$ and $g_i^n$:

$$h_i^n = c_n \cdot h_i^{n-1} - \bar{s}_n \cdot g_{i-1}^{n-1} \qquad \text{VI}$$

and $$g_i^n = s_n \cdot h_i^{n-1} + c_n \cdot g_{i-1}^{n-1}$$

Expression IV can also be reversed and become:

$$\alpha_{n-1} = c_n \alpha_n + \bar{s}_n \beta_n \qquad \text{VIII}$$

$$\beta_{n-1} = z(-s_n \alpha_n + c_n \beta_n)$$

At this stage of the mathematical calculation, the following considerations are worthy of mention. If $\alpha_n$ and $\beta_n$ have been given as representative of a magnetic moment at the end of excitation, it is possible from a knowledge of $c_n$ and $s_n$ which are representative of the last Dirac pulse of the excitation to deduce the values of the magnetic moment $\alpha_{n-1}$ and $\beta_{n-1}$, just before application of said last Dirac pulse. From one point to the next, by determining the preceding Dirac pulse each time, it is possible to retrace the variation of the moment and to determine in reverse the history of the excitation from its origin to its end. The question which then arises is to determine whether it is possible to choose $c_n$ or $s_n$ as required or on the contrary whether these values are imposed. To state that these values are imposed is equivalent to stating that the Dirac pulse number n is known in amplitude. When examining VIII and recalling that $\alpha_n$ and $\beta_n$ are polynomials of degree n in $z^{-1}$, it immediately results that $$O = c_n h_n^n + s_n g_n^n$$

and

-continued $$O = -s_n h_0^n + c_n g_0^n$$

In fact the polynomial of degree $n-1$ in $z^{-1}$ which is representative of $\alpha_{n-1}$ cannot contain terms of degree n in $z^{-1}$. Similarly, the polynomial of degree $n-1$ in $z^{-1}$ which is representative of $\beta_{n-1}$ cannot contain terms in $z^1$. This pair of conditions virtually consists in setting the following equations:

$$\frac{s_n}{c_n} = \frac{e^{j\phi_n} \cdot \sin \theta_n/2}{\cos \theta_n/2} = tg \frac{\theta_n}{2}, \quad e^{j\phi_n} = \frac{h_n^n}{g_n^n} = \frac{g_0^n}{h_0^n} \quad \text{X}$$

This consists in establishing that $\theta_n$ and $\phi_n$ are the two unknown quantities of a system of four equations having two unknown quantities. In principle, it should be found here that resolution is impossible.

But the fact of stating that the probability that the magnetic moment exists has a value of 1 is equivalent to writing that:

$$|\alpha_n|^2 + |\beta_n|^2 = 1 \quad \text{VII}$$

or again: $\alpha_n \overline{\alpha_n} + \beta_n \overline{\beta_n} = 1$ \quad VII This expression VII can be developed by replacing $\alpha_n$ and $\beta_n$ by their value given in expression V. By carrying out this last calculation and by classifying the coefficients obtained in powers of z to which they apply, we may write:

$$h_0^n \overline{h_n^n} + g_0^n \overline{g_n^n} = 0 \text{ terms in } z^{-n}$$

$$\overline{h_0^n} h_{n-1}^n + \overline{h_1^n} h_n^n + \overline{g_0^n} g_{n-1}^n + \overline{g_1^n} g_n^n = 0 \text{ terms in } z^{-(n-1)}$$

$$\ldots = 0$$

$$h_0^n \overline{h_0^n} + h_1^n \overline{h_1^n} + \ldots + h_n^n \overline{h_n^n} +$$

$$g_0^n \overline{g_0^n} + g_1^n \overline{g_1^n} + \ldots + g_n^n \overline{g_n^n} = 1 \text{ terms in } z^{-0}$$

$$\ldots = 0$$

$$h_0^n \overline{h_n^n} + g_0^n \overline{g_n^n} = 0 \text{ terms in } z^n$$

This system of equations comprises $n+1$ equations and not $2n$ equations, with $2n+2$ unknown quantities. In fact, the equations in which the terms are in $z^{-i}$ or in $z^i$ are the same. On the other hand there are in fact $2n+2$ terms in $h_i^n$ and $g_i^n$ which are unknown. It is worthy of note that the first and last equations reduce the impossibility of determination of $\theta_n$ and of $\phi_n$ as had previously been apparent. In fact, the last two terms of Expression IX are identical with each other in accordance with the condition imposed on the probability of the amplitude of the magnetic moment. In consequence, the two equations having two unknowns $\theta_n$ and $\phi_n$ are soluble. As a result, $\theta_n$ and $\phi_n$ are established by the nature of the polynomials $h_i^n$ and in $g_i^n$ which have been retained. It is therefore possible to calculate $\alpha_{n-1}$ and $\beta_{n-1}$ in application of Expression VIII. Hence, $\theta_{n-1}$ and $\phi_{n-1}$ are deduced. The sequence of Dirac pulses which compose the excitation can thus be calculated in this order.

At this stage of the explanation, the situation can be resumed by stating that it is possible to choose two polynomials of degree n from a large set of possible polynomials (on account of the system of $n+1$ equations having $2n+2$ unknowns). Once said polynomials have been chosen, it is known to calculate the sequence of excitations in the form of Dirac pulses which have led to the polynomials in question, starting from a magnetic moment of given orientation. Then, by repeating the approximation by hard pulse, but this time in reverse, a pseudo-continuous or even continuous value can be given to the amplitude of the excitation. In other words, the physical expression of the phenomenon has just been transformed. In this last expression, it is possible simply to carry out optimizations. All optimizations will apply to a choice as a function of given optimization criteria of the coefficients $h_i^n$ and $g_i^n$, the values of which are in accordance with the conditions set forth in Expression VII. The optimization calculations further consist of frequency filter calculations. It is known to impose conditions of amplitudes and phases on such filters.

From a macroscopic point of view, the general effect of the radio-frequency excitation combined with the movement of precession is that of subjecting the magnetization to a rotation of angular parameters $\theta(w)$, psi(w) and phi(w), where $\theta$, psi and phi are the Euler angles defining this rotation, w is the resonance angular frequency considered. As is the case with a and b, each of the three angles $\theta$, psi and phi is a function of the history of the excitation $w_1(t)$ and can be found in the case of each w by integration of the Bloch equations in time. There exists a direct correspondence between the Euler angles of this rotation and the amplitudes of probability a and b, solutions of the Schrödinger equation (Albert Messiah, "Quantum mechanics", Vol. II, pages 918, 919 and 922). These correspondences are written:

$$a = \epsilon \exp (j \, phi/2) \cos (\theta/2) \exp (j \, psi/2)$$

$$b = \epsilon \exp (-j \, phi/2) \sin (\theta) \exp (j \, psi/2)$$

with $\epsilon = \pm 1$

These relations can be reversed so as to obtain:

$$\cos \theta = (a\bar{a} - b\bar{b}) = (\alpha\bar{\alpha} - \beta\bar{\beta})$$

whence $$\cos \theta = 1 - 2 \beta\bar{\beta} = 2 \alpha\bar{\alpha} - 1$$

and $$psi = Arg (a \cdot b) = Arg (z^n \cdot \alpha \cdot \beta)$$

$$phi = -Arg (\bar{a} \cdot b) = -Arg (\bar{\alpha} \cdot \beta)$$

It can be endeavored to solve the problem which consists in approximating a given angle of nutation $\theta(w)$ over an entire domain of w without being concerned with the angles psi and phi.

It is known that, if the excitation is a train of n Dirac pulses, then the resultant coefficients $\underline{\alpha}$ and $\underline{\beta}$ are polynomials of order n in $z^{-1}$. It can then readily be seen that, taking into account that $|z|=1$ and therefore that the conjugate of z is equal to $z^{-1}$, that $\beta\bar{\beta}$ and $\alpha\bar{\alpha}$ are "polynomials" of "degree"2n (power of z from $-n$ to $+n$). These polynomials also have the distinctive feature of being symmetrical and can accordingly be written as follows:

$$\beta\bar{\beta} = \rho_0 + \sum_{1}^{n} (\rho_i z^{-i} + \rho_i z^i) = \rho(z)$$

-continued where $\rho_i = \sum_{l=0}^{n-i} g_l^{-n} \cdot g_{l+i}^n$

To find the coefficients $\rho_i$ which most closely approximate to a given frequency response (cos θ(w) -1)/2 is a conventional filtering problem. See for example A. V. Oppenheim, R. W. Schaefer, Digital Signal Processing, Chapter 5. It will be found preferable to utilize the so-called Remez exchange algorithm set forth in this reference and published in the IEEE Transactions on Circuit Theory, CT-19, 189-194, March 1972 by Messrs. T. W. Parks and J. H. McClellan under the title "Chebyshev approximation for non-recursive digital filters with linear phase". In additional to its character of optimality, this algorithm has the advantage of readily accounting for the constraint:

$$0 < \beta\bar{\beta} < 1$$

Once the coefficients $\rho_i$ have been determined, it is possible to find the polynomials ρ(z). In fact, if $z_i$ is a zero of β then ρ(z)=β$\bar{\beta}$ has as zero $z_i$ and $1/\bar{z_i}$. Conversely, from a knowledge of the 2n zeros of ρ(z), $\underline{\beta}$ is constructed by choosing from each of the n pairs ($z_i$, $1/\bar{z_i}$) one of its elements $z_i$ or $1/z_i$. There are therefore n possible binary choices and, for a given $\beta\bar{\beta}$, 2n possible solutions in the case of $\underline{\beta}$. The same applies to $\underline{\alpha}$: for a given $\alpha\bar{\alpha}$ there are $2^n$ possible solutions $\underline{\alpha}$. For a cos O(w) which is approximated as nearly as possible by a ρ(z), there are therefore $4^n$ solutions for the two other Euler angles psi and phi.

It is also possible by searching for zeros of ρ(z) and 1-ρ(z) to examine all the psi and phi solutions but it can be understood that this operation is long and tedious. In fact, the number of possible solutions is not as large as would appear to be the case at first sight since the Remez algorithm tends to place the maximum number of possible zeros on the unity circle $|z|=1$, and in this case $z_i=1/\bar{z_i}$.

So far as $\underline{\alpha}$ is concerned, it is possible as a general rule to restrict investigations to a minimum phase solution. This solution corresponds to choosing between the zeros $z_i$ and $1/\bar{z_i}$ the zero which is within the unity circle. In fact, this solution can be found without having to search for the zeros of 1- p(z) by means of a simple algorithm invented by Messrs R. Boite and H. Leich, published in Signal Processing, 1981, pages 101 to 108 by North Holland Publishing Company in an article entitled "A new procedure for the design of high order minimum phase for digital or CCD filters". From a physical standpoint, the minimum-phase solution for α is justified by the fact that it results in the lowest excitation energy after inversion of the Schrödinger equations by IX. In fact, it is known that, among all the solution $\underline{\alpha}$ of $\alpha\bar{\alpha}=1-\rho$, the minimum-phase solution is that which has the highest zero-order coefficient $h_0{}^n$. In fact, if the relations VI are again employed, it is found that:

$$h_0{}^n = \cos\frac{\theta_{n-1}}{2} \cdot \cos\frac{\theta_{n-1}}{2} \ldots \cos\frac{\theta_0}{2}$$

If we take the logarithm of this value and if we consider that the contributions made by each $w_i$ to the total nutation of the magnetic moment are small, we may write after having performed a limited development of cosine $\theta_i$:

$$\text{Log } h_0{}^n = -\tfrac{1}{8} \sum_{0}^{n} (\theta_i)^2$$

Since it has been seen that $h_0{}^n$ had the highest value, it is deduced therefrom that the sum of squares of the $\theta_i$ is the lowest. The result thereby achieved is that the pulses, the sequence of which produces a sum of the two Euler angles psi+phi of minimum values, are precisely those which correspond to the minimum excitation energy in respect of a given angle of nutation θ. This result was not known hitherto.

A more restrictive approach of the definition of the polynomial $\underline{\alpha}$ and $\underline{\beta}$ consists in imposing at the outset constrain on the phases arg (a) or arg (b). In particular, one may imagine that arg (b)=0. This is equivalent to imposing that the coefficients of the polynomial $\underline{\beta}$ are symmetrical or in other words that $$g_{n-i}^n = g_i^n$$

The polynomial $\underline{\beta}$ can then be found by optimization of the angle of nutation θ(w) by means of the Remez algorithm. $\beta\bar{\beta}$ and $\alpha\bar{\alpha}$ are then deduced therefrom. Thereupon, $\underline{\alpha}$ is chosen with minimum phase. FIG. 2 shows the shape of a 180° pulse found by satisfying these conditions. This figure is associated with a first table (TAB 1) giving values of the amplitude of the excitation as a function of a certain number of periods (the periods are given in reduced time and the amplitudes in radians). Since the form of this excitation is symmetrical in time, only the 1+n/2 first periods are tabulated. In the example, there are 59. For technological reasons, this pulse may give rise to peak powers at the center which are too high for the generators 3 employed. Its shape may accordingly be modified by adopting one of the other solutions of $\underline{\alpha}$. There then results a pulse whose envelope is that shown in FIG. 3 and which corresponds under the same conditions to a second table of values: TAB 2. Experience has shown that compliance with the values indicated in these tables to within 3 or 5% does not have an adverse effect on the results of NMR experiments which make use of these values.

TABLE 1

—5.90491088820821E-002
—8.96631980134976E-003
—9.23166598598407E-003
—9.19677465040708E-003
—8.83432825998123E-003
—8.12591456552324E-003
—7.05961652094723E-003
—5.63477557258307E-003
—3.86253911015924E-003
—1.76486435138458E-003
6.25476838024989E-004
3.26440690345683E-003
6.09583076591332E-003
9.05216904390593E-003
1.20555142561780E-002
1.50196768191874E-002
1.78517413596757E-002
2.04537546376259E-002
2.27246168285321E-002
2.45630146956734E-002
2.58710287153642E-002
2.65578861205690E-002
2.65431355656157E-002
2.57591139192740E-002
2.41545403155147E-002
2.16956917805766E-002
1.83713380832749E-002
1.41945062109303E-002

TABLE 1-continued 9.20457660885527E-003
3.46765560648096E-003
−2.92329100733593E-003
−9.84733908635224E-003
−1.71530173784658E-002
−2.46571535816664E-002
−3.21442219464214E-002
−3.93693814016602E-002
−4.60621260029187E-002
−5.19305174898276E-002
−5.66364696748610E-002
−5.98922285225749E-002
−6.13121319539390E-002
−6.05981140778251E-002
−5.74494739112295E-002
−5.15620362699079E-002
−4.26629999764663E-002
−3.05055681138646E-002
−1.48618108573401E-002
4.48331838517662E-003
2.77314167977565E-002
5.50461462341715E-002
8.64972905264657E-002
1.21951561422393E-001
1.60897065098579E-001
2.02203063971342E-001
2.43859077421071E-001
2.82823939221931E-001
3.15186979218870E-001
3.36828780839445E-001
3.44519101220846E-001

TABLE 2

−6.43620153219991E-002
−2.22906739796626E-002
−2.49869020943108E-002
−2.68990157438880E-002
−2.77707368058623E-002
−2.73594711916511E-002
−2.54479434557955E-002
−2.18635472488279E-002
−1.64935465610009E-002
−9.29751166465141E-003
−3.19132207764246E-004
1.03029077408931E-002
2.23249500506281E-002
3.53908627237378E-002
4.90274190615515E-002
6.26451148417868E-002
7.55466371967290E-002
8.69479228151243E-002
9.60155221415116E-002
1.01921802249669E-001
1.03913138439167E-001
1.01380187889778E-001
9.39155521524178E-002
8.13463565002227E-002
6.37390221677407E-002
4.13790603273035E-002
1.47486548149161E-002
−1.54839234400107E-002
−4.84424410168841E-002
−8.29852331684852E-002
−1.17625795521197E-001
−1.50471465648678E-001
−1.79244867442907E-001
−2.01459013842493E-001
−2.14769285613060E-001
−2.17434784481117E-001
−2.08716918900358E-001
−1.89030077066345E-001
−1.59738970570616E-001
−1.22847407686439E-001
−8.04057612979931E-002
−3.43898608033687E-002
1.34844833846245E-002
6.16742852514041E-002
1.08582606007642E-001
1.52372560401071E-001
1.90896870985005E-001
2.21841112220419E-001

TABLE 2-continued 2.43114767835960E-001
2.53390364178345E-001
2.52576807632722E-001
2.41983570764297E-001
2.24083705311999E-001
2.01994161175123E-001
1.78905167599749E-001
1.57651976499981E-001
1.40485395387081E-001
1.29003722671106E-001
1.24164376232861E-001

What is claimed:

1. A process for electromagnetic excitation, by a radio-frequency signal, of nuclear particles of a body under examination, said process being performed in a nuclear magnetic resonance device and said nuclear particles being contained in a predetermined investigation volume of said device and subjected to said excitation wherein said device includes a means for applying said excitation to said body as well as electronic data processing means wherein flips of magnetic moments of aid nuclear particles are imposed with amplitudes and phases for a given set of resonance frequencies wherein said given set of resonance frequencies includes all frequency components involved in said investigation volume by said excitation, in response to said excitation, said process comprising the steps of:

introducing a Schrodinger equation in said data processing means relative to a probability amplitude of a wave function of spins of said particles which are resonant at a given resonance frequency, an Hamiltonian of said Schrödinger equation being constituted by a function dependent on a frequency and a shape of an excitation pulse applied to said spins;

integrating said Schrodinger equation with respect to time in said data processing means and deducing therefrom polynominal analytical expressions of said probability amplitude at the end of said excitation pulse, as a function of a variable representing said resonance frequency wherein said variable is present in said polynominal analytical expression at a degree equal to a number of elementary periods and wherein a sum of durations of said elementary periods is equal to a duration of said pulse and said variable being weighted in said polynominal analytical expressions by coefficients representative of the actual excitation profile caused by said excitation pulse and undergone, during said periods, by said spins, said coefficients being a function of a location variable of said investigation volume;

optimizing said coefficients by said data processing means in order that said polynominal analytical expressions approach as nearly as possible a desired predetermined form;

deducing from said optimized coefficients, for each of said elementary periods, characteristics of said excitation pulse leading to said desired predetermined frequency and shape of said flips of magnetic moments; and exciting said particles of said volume with said excitation signal.

2. The process according to claim 1 wherein the step of integrating involves an integration approximation by a hard pulse technique.

3. The process according to any one of claim 1 or 2 wherein the step of optimizing said coefficients includes the step of locating polynominal analytical expressions with minimum, phase shift which correspond to an excitation with a minimum power.

* * * * *